United States Patent [19]
Heck

[11] Patent Number: 5,222,253
[45] Date of Patent: Jun. 22, 1993

[54] TRANSIENT SUPPRESSION CIRCUIT FOR A TIME DOMAIN DUPLEX TRANSCEIVER

[75] Inventor: Joseph P. Heck, Fort Worth, Tex.

[73] Assignee: Motorola, Inc., Schaumburg, Ill.

[21] Appl. No.: 574,628

[22] Filed: Aug. 29, 1990

[51] Int. Cl.[5] .............................................. H04B 1/44
[52] U.S. Cl. ....................................... 455/78; 455/315
[58] Field of Search ................ 455/77, 78, 80, 307, 455/324, 82, 315

[56] References Cited

U.S. PATENT DOCUMENTS

| | | | |
|---|---|---|---|
| 3,665,507 | 5/1972 | Peil | 455/324 |
| 4,287,599 | 9/1981 | Goncharoff et al. | 455/78 |
| 4,385,402 | 5/1983 | Barrs | 455/307 |
| 4,476,585 | 10/1984 | Reed | 455/324 |
| 4,653,117 | 3/1987 | Heck | 455/209 |
| 4,761,829 | 8/1988 | Lynk, Jr. et al. | 455/307 |
| 4,837,853 | 6/1989 | Heck | 455/208 |
| 4,885,801 | 12/1989 | Hansen | 455/307 |
| 4,903,257 | 2/1990 | Takeda et al. | 455/83 |
| 4,955,039 | 9/1990 | Rother et al. | 455/324 |

Primary Examiner—Reinhard J. Eisenzopf
Assistant Examiner—Edward Urban
Attorney, Agent, or Firm—Michael J. Buchenhorner; Pedro P. Hernandez

[57] ABSTRACT

A radio transceiver is coupled to a source of a reference waveform, and includes transmit mode receive modes. The transceiver comprises a first down mixer, a first low pass filter coupled the first down mixer, and a first selective coupling switch. The first down mixer is coupled to receive an input signal having an input frequency, for mixing the input signal with the reference waveform to produce a first signal. The first signal has a frequency substantially lower than the input frequency. The first low pass filter is coupled the first down mixer for producing a filtered first signal. The first selective coupling switch couples the first down mixer and the low pass filter when the radio transceiver is in the receive mode, and decouples the first down mixer and the low pass filter when the radio transceiver is in the transmit mode, thus substantially eliminating transient disturbances.

10 Claims, 3 Drawing Sheets

TRANSIENT SUPPRESSION CIRCUIT FOR A TIME DOMAIN DUPLEX TRANSCEIVER

TECHNICAL FIELD

This invention relates generally to time domain duplex transceivers, and more specifically to those using zero-intermediate frequency (IF) receivers.

BACKGROUND

In a time domain duplex transceiver, effectively simultaneous transmission and reception of information is achieved by alternately transmitting and receiving information over a very short interval on a single radio frequency channel. The transmitted data is compressed 2:1 before transmission and the received data is correspondingly expanded 2:1 in time. To avoid any noticeable delays and to minimize fading effects, the transmit and receive intervals must be kept very short, on the order of 1 ms, as in the second generation cordless telephone systems (also known as Cordless Telephone-2, or simply CT-2). With such short receive intervals, it is obviously necessary for the receiver to begin demodulating the transmitted data virtually immediately in order to maintain reasonable system efficiency. For example, if the receiver takes 0.5 ms to begin demodulating data correctly, only 50% efficiency would be achieved if the receive interval is 1.0 ms. For the CT-2 system, it is required that correct data detection be achieved in no more than about 10 microseconds after the receive mode is entered. It can thus be appreciated that this poses some severe performance requirements on the receiver. In the process of switching from the transmit mode to the receive mode, certain transient disturbances normally occur which would prevent the receiver from proper reception for a substantial period of time. These disturbances are typically much worse in a zero IF receiver because of the long time constants which are usually required, and because there are more potential sources of disturbance with a zero IF radio. The methods shown in this invention virtually eliminate these transient disturbances.

SUMMARY OF THE INVENTION

Accordingly, it is an object of the present invention to overcome the detriments of the prior art.

Briefly, according to the invention, a radio transceiver is coupled to a source of a reference waveform, and includes transmit mode receive modes. The transceiver comprises a first down mixer, a first low pass filter coupled the first down mixer, and first selective coupling means. The first down mixer is coupled to receive an input signal having an input frequency, for mixing the input signal with the reference waveform to produce a first signal. The first signal has a frequency substantially lower than the input frequency. The first low pass filter is coupled the first down mixer for producing a filtered first signal. The first selective coupling means couples the first down mixer and the low pass filter when the radio transceiver is in the receive mode, and decouples the first down mixer and the low pass filter when the radio transceiver is in the transmit mode, thus substantially eliminating transient disturbances.

DETAILED DESCRIPTION OF THE PREFERRED EMBODIMENT

Figure 1:
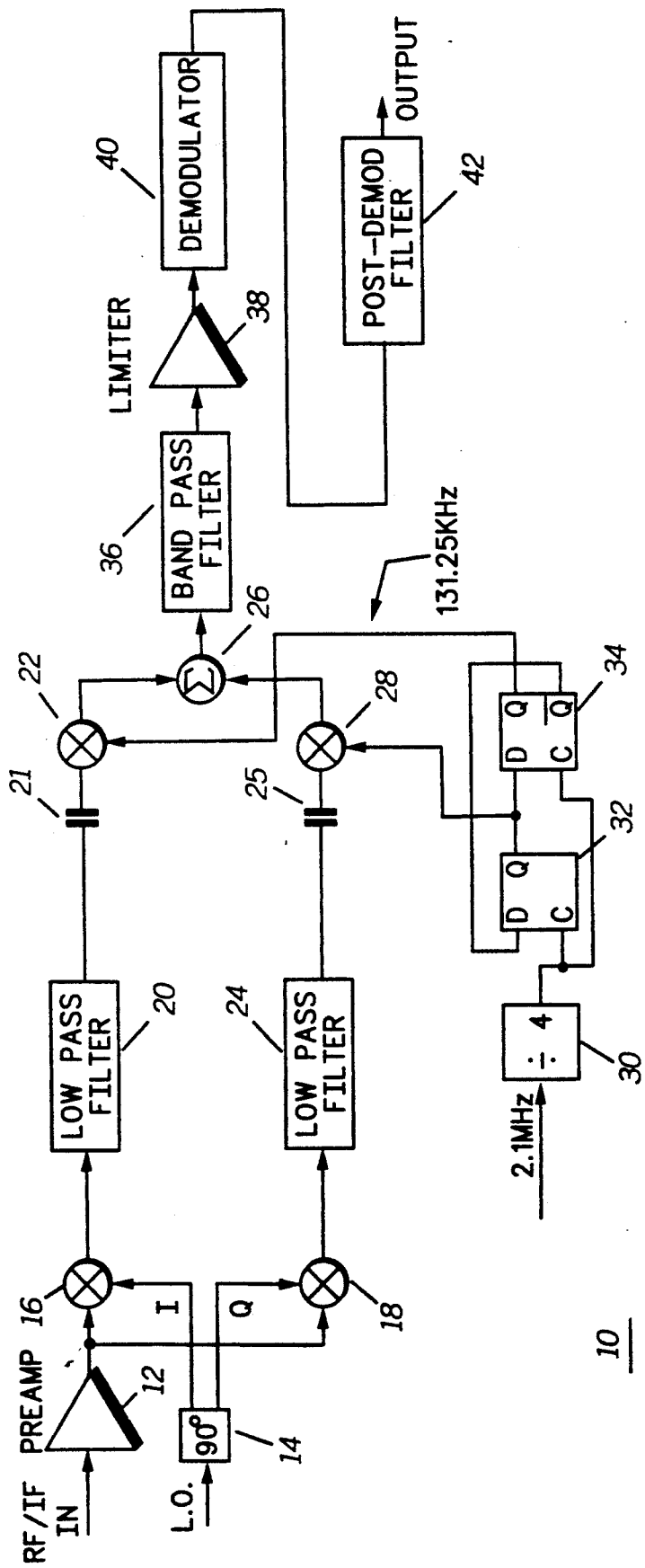
FIG. 1 is a block diagram of a known zero IF radio receiver in which the invention can be used.

Referring to FIG. 1, there is shown a block diagram of a known zero IF receiver 10. A preamplifier 12 receives a radio-frequency (RF) or IF input signal, which it amplifies and applies to down-mixers 16 and 18. A phase-shifting circuit 14 receives a local oscillator (L.O.) waveform and produces an inphase waveform (I) and a quadrature waveform (Q) in response to the L.O. waveform. The I and Q signals are applied to down mixers 16 and 18 for multiplication with the input signal. The down mixers 16 and 18 convert the signal from the RF or IF to baseband frequency. Lowpass filters 20 and 24 filter the baseband signals to remove interference and limit the noise bandwidth of the receiver 10. Lowpass filters 20 and 24 are coupled to a pair of up conversion mixers 22 and 28 through coupling capacitors 21 and 25. Up mixers 22 and 28 then convert the baseband signals up to a convenient frequency for further processing and demodulation. Inphase and quadrature reference signals (having a frequency of 131.25 kHz, for example) for mixing by the up mixers 22 and 28 are provided by a network that includes a divide-by-four divider 30, and two "D" flip flops 32 and 34. The "Q" output of flip flop 32 is applied to mixer 28, and the "Q(bar)" output of flip flop 34 is applied to the mixer 22. An adder 26 combines the signal produced by the up mixer 22 with the signal produced by the up mixer 28. A bandpass filter 36 (e.g., a 2-pole filter with a nominal bandwidth somewhat greater than twice the baseband filter bandwidth) filters the signal produced by the adder 26, and produces a signal having a frequency of 131.2785 kHz (in this example). A limiter 38 limits the signal produced by the filter for demodulation by a demodulator 40. A post-demodulator filter 42 filters the demodulated signal before presentation to a listener. This system is described in some detail in U.S. Pat. Nos. 4,653,117 and 4,837,853 which are hereby incorporated by reference.

A primary cause of transient disturbance is the inevitability that some amount of the local oscillator signal which is applied to the down-mixers 16 and 18 will get into the RF input of the mixers 16 and 18 (most likely through the preamp input) and will mix with itself causing a DC shift in the output signal of the mixers. In the transmit mode, the injection may be applied to an amplifier or it may be turned off; the preamp 10 may also be turned off. Any one or all of these changes, which occur at the transition of going from the transmit to the receive mode, cause a disturbance which will propagate through the baseband filters 20 and 24 to the coupling capacitors 21 and 25 at the inputs to the up-conversion mixers 22 and 28. Since the time constant associated with these coupling capacitors is long (on the order of 100 ms), any DC shift occurring at this point would cause an intolerably long transient. Also, the DC shift at the input to the baseband filters would cause a transient with duration set by the step response of the filters. Since DC at baseband is equivalent to a carrier on the signal, the transient DC shifts caused by the transmit-to-receive transition would cause a temporary false carrier to appear at the output of the up-conversion mixers 22 and 28, and would prevent proper demodulation of the signal until such false carrier would subside.

Another source of transient disturbance is at the demodulator 40. In the transmit mode, no signal is applied to the demodulator 40, and the demodulator output will tend to go toward some undetermined state, usually either its maximum or minimum level. When a signal is then applied to the demodulator 40 at the initiation of the receive mode, the demodulator 40 must transverse a large voltage range before proper demodulation is achieved. The time required for this transition is set by the demodulator bandwidth and by the particular characteristics of the type of demodulator used. This problem is aggravated by the transient response characteristics of the post demodulation filter 42 which must be present for optimum data detection. The recovery time is thus further stretched by an amount approximately equal to the impulse response of the post demodulation filter 42.

Another problem which can delay the proper reception of signals just after the transition of transmit to receive mode is caused by the AGC (automatic gain control) which is necessary because of the active filters used in the receiver. If the AGC voltage is allowed to decay in the transmit mode, then proper reception will be delayed by the AGC attack time when returning to the receive mode. Yet another problem which must be solved is achieving proper indication of RSSI (Received Signal Strength Indicator) while switching from transmit to receive in the time domain duplex fashion. The invention prevents these intolerable effects by the addition of several transmission gate switches as shown in FIGS. 2 and 3.

Figure 2:
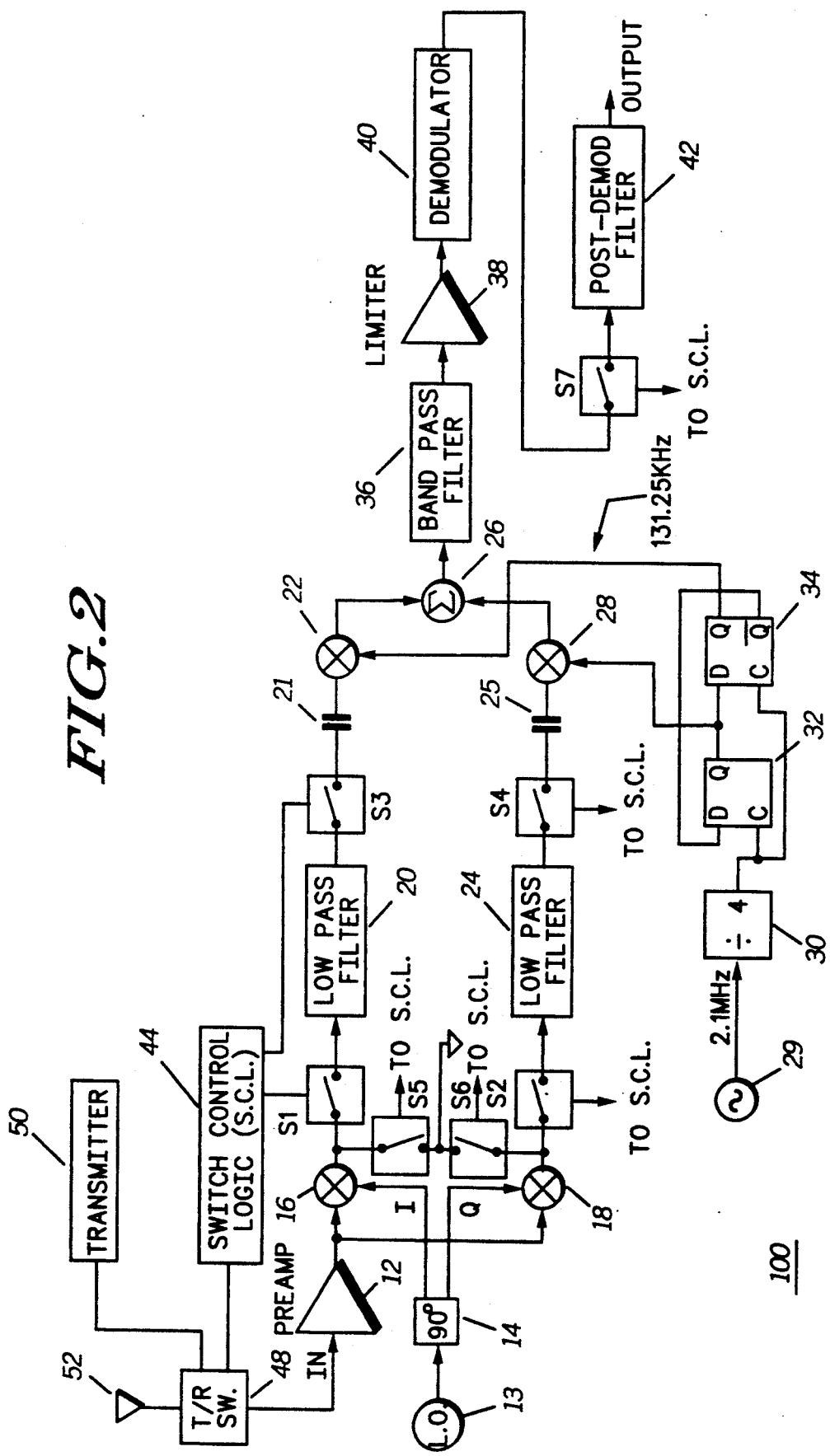
FIG. 2 is a block diagram of a transceiver including the receiver of FIG. 1 and embodying the invention.
Figure 3:
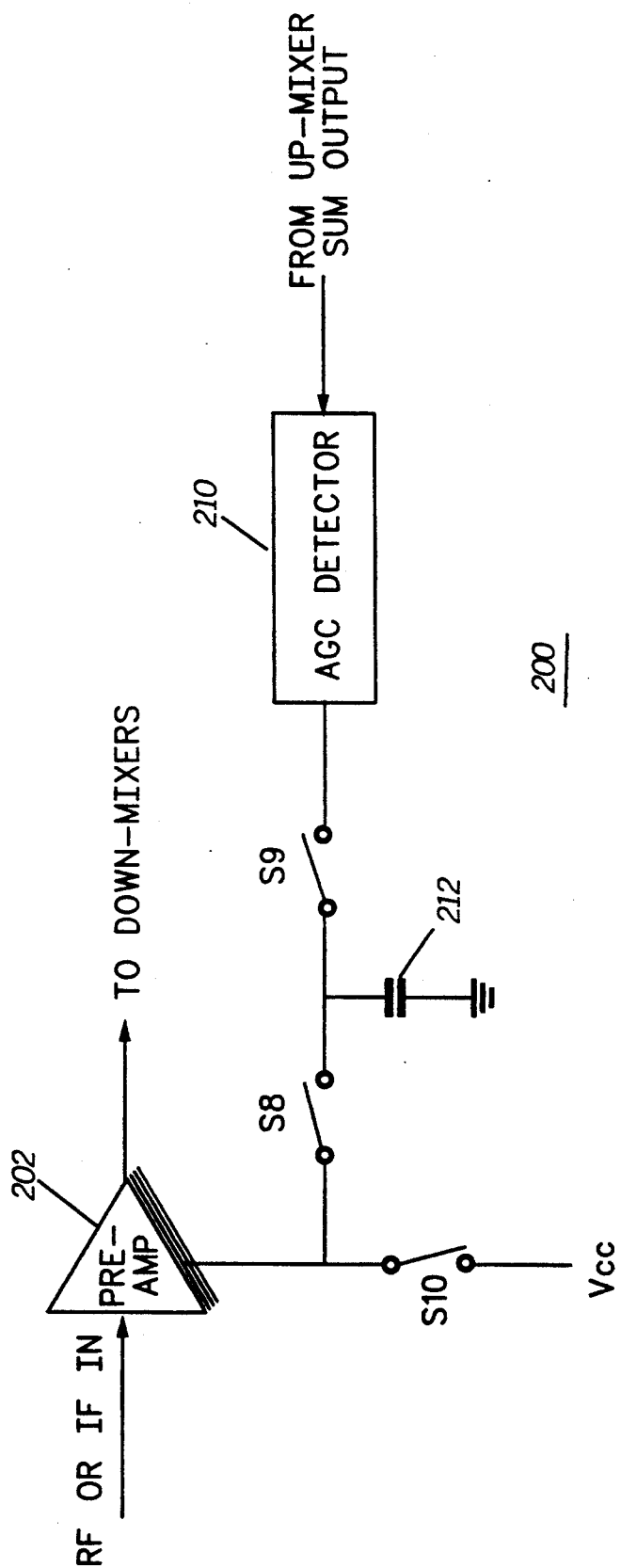
FIG. 3 is a block diagram of another circuit embodying the invention.

First, referring to FIG. 2, there is shown a radio transceiver 100 that includes a modified version of receiver 10 of FIG. 1. The receiver 10 has been modified by adding series switches S1–S4 at both the inputs and the outputs of the baseband lowpass filters 20 and 24, switches S5 and S6 from the inputs of filters 20 and 24 to analog ground, and S7 between the modulator 40 and the post-demodulation filter 42. These switches (except S5 and S6) are normally closed in the receive mode. The radio transceiver 100 also includes an antenna 52 coupled to a transmit/receive switch 48. When the transceiver is in the transmit mode, a conventional transmitter 50 is coupled to the antenna 52; and when it is in the receive portion is coupled to the antenna 52. A switch control logic circuit 44 controls the selective opening and closing of the switches S1–S7 in the receiver.

When going to the transmit mode, the switches are opened to prevent the DC shifts described above from propagating through the baseband path. However, since the baseband filters have a certain time delay, it is necessary to delay the opening of the switches at the end of a receive period to allow any signal which has just entered the baseband path to propagate through the filters and the up-conversion path. In addition to the series switches, shunt switches S5 and S6 are placed at the outputs of the down-conversion mixers which connect the mixer outputs to analog ground when in the transmit mode. This prevents a long recovery time in the mixer output circuit (which acts as a current sink) which may take place if the mixer outputs are allowed to float to their maximum or minimum voltage levels.

The transient disturbance at the output of the demodulator 40 is minimized by adding a series transmission gate switch S7 at the input to the post demodulation filter 42. The filter 36 is thus left in its normal quiescent state while the transmit mode is engaged, and the filter 36 can begin responding to the demodulated signal output without the need to traverse from a maximum or minimum output condition when the receive mode is entered.

Referring to FIG. 3, there is shown a block diagram showing how the AGC control voltage is held during the transmit period insuring that proper receiver gain is achieved immediately upon return to the receive mode. A preamplifier 202 receives an RF or IF input signal, amplifies it, and provides the amplified signal to down mixers (e.g., such as down mixers 16 and 18). A switch S10 selectively couples and decouples the supply voltage (Vcc) to the supply terminal of the preamplifier 202. An AGC capacitor 212 is disposed between the supply terminal of the preamplifier 202 and ground. Switches S8 and S9 are normally closed (in the receive mode) while S10 is normally open. During the transmit mode, S8 and S9 are open, effectively holding whatever control voltage happens to be present on the AGC capacitor 212. S10 is closed during transmit, forcing the preamplifier 202 into its minimum gain mode to isolate the down mixers from potentially high levels of RF which might otherwise get through the preamp and cause transients. The two switches S8 and S9 are used instead of a single switch in series with the AGC capacitor in order to prevent an AC voltage from developing at the preamp AGC input which would be caused by a ripple current which flows from the AGC detector 210 into the AGC capacitor 212. With the configuration shown, no AC current flows through S8 and the AGC control voltage is equal to the capacitor (212) voltage. A similar configuration is used to hold the RSSI filter voltage while in the transmit mode, although, in this case, a single switch (S11) in series with the RSSI filter capacitor 212 can be used along with an optional switch (S12) to Vcc.

What is claimed is:

1. A radio transceiver, coupled to a source of a reference waveform, and including a transmit mode and a receive mode, comprising:
   a first down mixer, coupled to receive an input signal having an input frequency, for mixing the input signal with the reference waveform to produce a first signal having a frequency substantially lower than the input frequency;
   a first low pass filter coupled the first down mixer for producing a filtered first signal;
   first selective coupling means for coupling the first down mixer and the first low pass filter when the radio transceiver is in the receive mode, and for decoupling the first down mixer and the first low pass filter when the radio transceiver is in the transmit mode:
   a second down mixer, coupled to receive the input signal and a quadrature reference waveform having the same frequency as the reference waveform and having a phase differing from the phase of the reference waveform by substantially ninety degrees, for mixing the input signal with the quadrature reference waveform to produce a second signal having a frequency substantially lower than the input frequency;
   a second low pass filter coupled the second down mixer for producing a filtered second signal; and
   second selective coupling means for coupling the second down mixer and the second low pass filter when the radio transceiver is in the receive mode, and for decoupling the second down mixer from the second low pass filter when the radio transceiver is in the transmit mode.

2. A radio transceiver, coupled to a source of a reference waveform, and including a transmit mode and a receive mode comprising:

a first down mixer, coupled to receive an input signal having an input frequency, for mixing the input signal with the reference waveform to produce a first signal having a frequency substantially lower than the input frequency;

a first low pass filter coupled the first down mixer for producing a filtered first signal; and first selective coupling means for coupling the first down mixer and the first low pass filter when the radio transceiver is in the receive mode, and for decoupling the first down mixer and the first low pass filter when the radio transceiver is in the transmit mode;

a first up mixer coupled to the first low pass filter and coupled to receive a second quadrature reference signal for mixing the filtered first signal and the second quadrature reference signal; and second selective coupling means for coupling the first up mixer and the first low pass filter when the radio transceiver is in the receive mode, and for decoupling the first up mixer from the first low pass filter when the radio transceiver is in the transmit mode.

3. The radio transceiver of claim 1, further comprising:

a source of a second reference waveform;

an up mixer coupled to the second low pass filter and coupled to receive a second quadrature reference waveform having the same frequency as the second reference waveform and having a phase differing from the phase of the second reference waveform by substantially ninety degrees, for mixing the second filtered signal with the second quadrature reference waveform to produce a third signal having a frequency substantially higher than the filtered second signal; and third selective coupling means for coupling the up mixer and the second low pass filter when the radio transceiver is in the receive mode, and for decoupling the up mixer from the second low pass filter when the radio transceiver is in the transmit mode.

4. The radio transceiver of claim 1, further comprising:

third selective coupling means for coupling the input of the first low pass filter to analog ground potential when the transceiver is in the transmit mode, and for decoupling the input of the first low pass filter to analog ground potential when the transceiver is in the receive mode; and fourth selective coupling means for coupling the input of the second low pass filter to analog ground potential when the transceiver is in the transmit mode, and for decoupling the input of the second low pass filter to analog ground potential when the transceiver is in the receive mode.

5. The radio transceiver of claim 1, further comprising:

a first up mixer coupled to the first low pass filter and coupled to receive a second quadrature reference signal for mixing the filtered first signal and the second quadrature reference signal;

a second up mixer coupled to the second low pass filter and coupled to receive a third quadrature reference signal for mixing the filtered second signal and the third quadrature reference signal;

combining means for combining the signal produced by the first up mixer with the signal produced by the second up mixer;

a demodulator coupled to the combining means;

a post demodulator filter coupled to the demodulator; and third selective coupling means for coupling the demodulator and the post demodulator filter when the transceiver is in the receive mode, and for decoupling the demodulator from the post demodulator filter whin the transceiver is in the transmit mode.

6. A radio transceiver, coupled to a source of a reference waveform, and including a transmit mode and a receive mode, comprising:

a first down mixer, coupled to receive an input signal having an input frequency, for mixing the input signal with the reference waveform to produce a first signal having a frequency substantially lower than the input frequency;

a first low pass filter coupled the first down mixer for producing a filtered first signal;

a first up mixer coupled to the first low pass filter and coupled to receive a second quadrature reference signal for mixing the filtered first signal and the second reference signal;

first selective coupling means for coupling the first up mixer and the first low pass filter when the radio transceiver is in the receive mode, and for decoupling the first up mixer from the first low pass filter when the radio transceiver is in the transmit mode;

a second down mixer, coupled to receive the input signal and a quadrature reference waveform having the same frequency as the reference waveform and having a phase differing from the phase of the reference waveform by substantially ninety degrees, for mixing the input signal with the quadrature reference waveform to produce a second signal having a frequency substantially lower than the input frequency;

a second low pass filter coupled the second down mixer for producing a filtered second signal; and second selective coupling means for coupling the second up mixer and the second low pass filter when the radio transceiver is in the receive mode, and for decoupling the second down mixer from the second pass filter when the radio transceiver is in the transmit mode.

7. A radio transceiver, coupled to a source of a reference waveform, and including a transmit mode and a receive mode, comprising:

a first down mixer, coupled to receive an input signal having an input frequency, for mixing the input signal with the reference waveform to produce a first signal having a frequency substantially lower than the input frequency;

a first low pass filter coupled the first down mixer for producing a filtered first signal;

first selective coupling means for coupling the input of the first low pass filter to analog ground potential when the transceiver is in the transmit mode;

a second down mixer, coupled to receive the input signal and a quadrature reference waveform having the same frequency as the reference waveform and having a phase differing from the phase of the reference waveform by substantially ninety degrees, for mixing the input signal with the quadrature reference waveform to produce a second signal having a frequency substantially lower than the input frequency;

a second low pass filter coupled the second down mixer for producing a filtered second signal;

second selective coupling means for coupling the input of the second low pass filter to analog ground potential when the transceiver is in the transmit mode; and third selective coupling means for coupling the first down mixer and the first low pass filter when the radio transceiver is in the receive mode, and for decoupling the first down mixer and the first low pass filter when the radio transceiver is in the transmit mode.

8. The radio transceiver of claim 7, further comprising:

fourth selective coupling means for coupling the second down mixer and the second low pass filter when the radio transceiver is in the receive mode, and for decoupling the second down mixer from the second low pass filter when the radio transceiver is in the transmit mode.

9. A radio transceiver, coupled to a source of a reference waveform, and including a transmit mode and a receive mode, comprising:

a first down mixer, coupled to receive an input signal having an input frequency, for mixing the input signal with the reference waveform to produce a first signal having a frequency substantially lower than the input frequency;

a first low pass filter coupled the first down mixer for producing a filtered first signal;

a first up mixer coupled to the first low pass filter and coupled to receive a second quadrature reference signal for mixing the filtered first signal and the second reference signal;

first selective coupling means for coupling the first up mixer and the first low pass filter when the radio transceiver is in the receive mode, and for decoupling the first up mixer from the first low pass filter when the radio transceiver is in the transmit mode;

a second down mixer, coupled to receive the input signal and a quadrature reference waveform having the same frequency as the reference waveform and having a phase differing from the phase of the reference waveform by substantially ninety degrees, for mixing the input signal with the quadrature reference waveform to produce a second signal having a frequency substantially lower than the input frequency;

a second low pass filter coupled the second down mixer for producing a filtered second signal;

second selective coupling means for coupling the second up mixer and the second low pass filter when the radio transceiver is in the receive mode, and for decoupling the second down mixer from the second pass filter when the radio transceiver is in the transmit mode; and third selective coupling means for coupling the first down mixer and the first low pass filter when the radio transceiver is in the receive mode, and for decoupling the first down mixer and the first low pass filter when the radio transceiver is in the transmit mode.

10. The radio transceiver of claim 9, further comprising:

fourth selective coupling means for coupling the second down mixer and the second low pass filter when the radio transceiver is in the receive mode, and for decoupling the second down mixer from the second low pass filter when the radio transceiver is in the transmit mode.

* * * * *